(12) United States Patent
Gregory et al.

(10) Patent No.: US 12,108,572 B2
(45) Date of Patent: Oct. 1, 2024

(54) FOLDED GRAPHITE FINS FOR HEATSINKS

(71) Applicant: Microsoft Technology Licensing, LLC, Redmond, WA (US)

(72) Inventors: Luke Thomas Gregory, Mercer Island, WA (US); Brandon Earl Gary, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 254 days.

(21) Appl. No.: 17/710,128

(22) Filed: Mar. 31, 2022

(65) Prior Publication Data

US 2023/0320035 A1 Oct. 5, 2023

(51) Int. Cl.
*H05K 7/20* (2006.01)

(52) U.S. Cl.
CPC .................... *H05K 7/2039* (2013.01)

(58) Field of Classification Search
CPC .. H01L 23/3672; H01L 23/373; H05K 7/2039
See application file for complete search history.

(56) References Cited

U.S. PATENT DOCUMENTS

| | | | | |
|---|---|---|---|---|
| 4,971,229 A | * | 11/1990 | Heimlich | G01F 11/268 222/440 |
| 6,257,887 B1 | * | 7/2001 | Heckerman | B29C 71/04 433/141 |
| 7,724,524 B1 | | 5/2010 | Campbell et al. | |
| 10,045,466 B1 | | 8/2018 | Chen et al. | |
| 10,238,011 B1 | | 3/2019 | Cui et al. | |
| 2002/0142165 A1 | | 10/2002 | Norley et al. | |
| 2007/0053168 A1 | * | 3/2007 | Sayir | H01L 23/367 257/E23.105 |
| 2010/0101927 A1 | * | 4/2010 | Ichikawa | H01H 9/52 428/68 |
| 2011/0232881 A1 | | 9/2011 | Downing et al. | |
| 2014/0224466 A1 | | 8/2014 | Lin et al. | |

(Continued)

FOREIGN PATENT DOCUMENTS

| CN | 111010851 A | 4/2020 |
|---|---|---|
| WO | 2013117213 A1 | 8/2013 |

OTHER PUBLICATIONS

Soule, Christopher A., "Future Trends in Heat Sink Design", Retrieved from: https://www.electronics-cooling.com/2001/02/future-trends-in-heat-sink-design/, Feb. 1, 2001, 15 Pages.

(Continued)

*Primary Examiner* — Henry T Crenshaw
(74) *Attorney, Agent, or Firm* — RAY QUINNEY & NEBEKER P.C.; Paul N. Taylor (57) ABSTRACT

A thermal management device includes a heat spreader and a folded graphite sheet. The heat spreader is configured to receive heat from a heat source. The folded graphite sheet is connected to the heat spreader to receive and exhaust heat from the heat spreader. The folded graphite sheet includes a first fin, a second fin, and a segment connecting the first fin and second fin. The first fin is oriented at least partially vertically away from the heat spreader. The second fin is oriented at least partially vertically away from the heat spreader. The folded graphite sheet is continuous through the first fin, the segment, and the second fin.

20 Claims, 4 Drawing Sheets

(56) References Cited

U.S. PATENT DOCUMENTS

| | | |
|---|---|---|
| 2016/0113149 A1 | 4/2016 | Krug et al. |
| 2016/0324031 A1 | 11/2016 | Fujiwara |
| 2017/0117451 A1 | 4/2017 | Matsumoto |
| 2018/0177074 A1 | 6/2018 | Wu |
| 2018/0246550 A1 | 8/2018 | Inaba et al. |
| 2019/0032909 A1 | 1/2019 | Koga et al. |
| 2020/0384731 A1 | 12/2020 | Beyerle |
| 2021/0185850 A1 | 6/2021 | Kulkarni et al. |
| 2021/0243843 A1* | 8/2021 | Nardo .................. A61F 7/0097 |

OTHER PUBLICATIONS

"International Search Report and Written Opinion Issued in PCT Application No. PCT/US23/010640", Mailed Date: May 3, 2023, 11 Pages.

* cited by examiner

FOLDED GRAPHITE FINS FOR HEATSINKS

BACKGROUND

Background and Relevant Art

Electronic devices, such as personal computing devices, server computing devices, handheld computing devices, and gaming consoles, are provided with fin packs for thermal efficiency. Conventional systems use aluminum, copper, steel, and other metals to conduct heat away from a heat source into a fluid flow to exhaust the heat into the fluid.

BRIEF SUMMARY

In some embodiments, a thermal management device includes a heat spreader and a folded graphite sheet. The heat spreader is configured to receive heat from a heat source. The folded graphite sheet is connected to the heat spreader to receive and exhaust heat from the heat spreader. The folded graphite sheet includes a first fin, a second fin, and a segment connecting the first fin and second fin. The first fin is oriented at least partially vertically away from the heat spreader. The second fin is oriented at least partially vertically away from the heat spreader. The folded graphite sheet is continuous through the first fin, the segment, and the second fin.

In some embodiments, a thermal management device includes a folded graphite sheet configured to receive and exhaust heat from a heat source. The folded graphite sheet includes a graphite core and an encapsulant on an outer surface of the graphite core, and the encapsulant is an electrically insulating material.

In some embodiments, a method of manufacturing a thermal management device includes forming a bend in a graphite sheet, wherein forming the bend includes elastically deforming an encapsulant layer of the graphite sheet; and heating at least a portion of the graphite sheet to reduce elastic stress in the encapsulant layer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 4-1 is a side cross-sectional view of a multi-layer graphite sheet, according to at least one embodiment of the present disclosure;

FIG. 4-2 is a flowchart illustrating a method of manufacturing a folded graphite sheet, according to at least one embodiment of the present disclosure;

FIG. 5-1 is a perspective view of a first encapsulant layer with encapsulant posts of a graphite sheet, according to at least one embodiment of the present disclosure;

FIG. 5-2 is a perspective view of a graphite core of the graphite sheet of FIG. 5-1, according to at least one embodiment of the present disclosure;

FIG. 5-3 is a side cross-sectional view of a graphite sheet with encapsulant posts, according to at least one embodiment of the present disclosure;

DETAILED DESCRIPTION

The present disclosure relates generally to systems and methods for thermal management of electronic and/or computing devices or components. More particularly, the thermal management devices described herein are configured to provide improved thermal conductivity in a variety of environments. In some embodiments, a thermal management device is positioned on a heat spreader and receives heat from one or more computing components of the electronic device. In some examples, the one or more computing components, such as a processor, system memory, hardware storage device, networking device, etc. is located in a small volume of available air flow or fluid flow to exhaust the heat, such as in server racks or portable personal computing devices (e.g., smartphone, head-mounted device, laptop computer, tablet computer, hybrid computer). A thermal management device according to the present disclosure includes graphite sheets at least partially covered by an encapsulant to increase the operational lifetime of the thermal management device and allow use in a variety of environments. In at least one embodiment, a thermal management device according to the present disclosure is stable in an immersion cooling liquid, such as used in a datacenter.

In some embodiments, a thermal management device according to the present disclosure is thermally connected to a heat spreader, which receives heat from at least one heat source in the electronic device. In some embodiments, the heat source is a processor, such as a central processing unit (CPU), a graphical processing unit (GPU); a storage device, such as random-access memory (RAM), other volatile memory, non-volatile memory, or combinations thereof; a network device; a power source; or other components of the electronic device. In some embodiments, the heat source is coupled directly to the thermal management device. In some embodiments, the heat source is thermally connected to the thermal management device with at least one thermally conductive or convective element therebetween.

In some examples, the heat source is thermally connected to the thermal management device by a thermal interface material (TIM), such as a thermal paste, sandwiched between a surface of the heat source and a surface of the thermal management device. In some examples, the heat source is thermally connected to the thermal management device by a heat pipe, vapor chamber, heat spreader, or other thermally conductive or convective element that transports heat from a surface of the heat source to a surface of the thermal management device. The thermal management device is thermally connected to the heat source when at least one element of a thermal management system is intended to physically connect the thermal management device to the heat source. In other words, a thermal management device that receives heat from the heat source only by ambient air flowing therebetween is not thermally connected, while a thermal management device connected to a heat source by a vapor chamber with a two-phase working fluid moving therein is thermally connected when a surface of the vapor chamber contacts a surface of the heat source and a surface of the thermal management device. In another example, a thermal management device is thermally connected to the heat source when the heat source is in contact with a first TIM, which contacts a surface of a heat pipe, which contacts a second TIM, which contacts a surface of the thermal management device.

Figure 1:
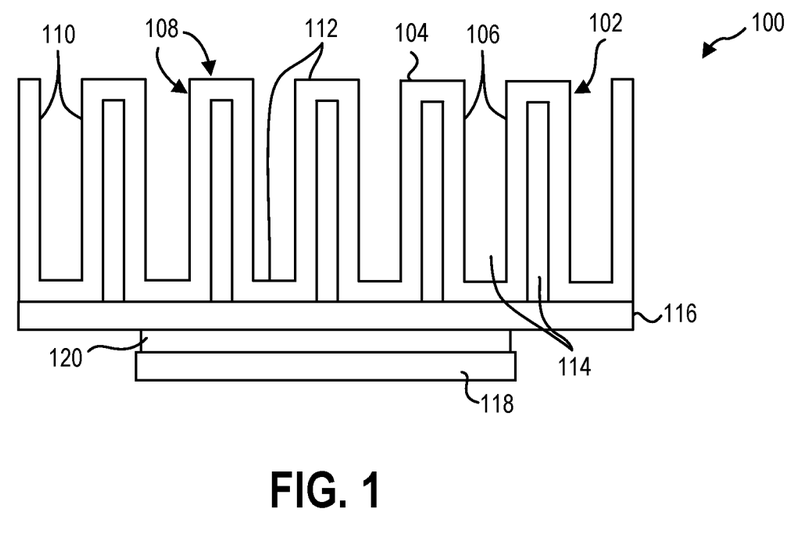
FIG. 1 is a side view of a thermal management device, according to at least one embodiment of the present disclosure.

FIG. 1 is an end view of a thermal management device 100. In some embodiments, the thermal management device 100 includes a folded graphite sheet 102 of graphite composite. The folded graphite sheet 102 includes at least one bend 104 in the sheet 102 to create a plurality of fins 106. In some embodiments, the bends 104 are substantially discontinuous corners, such as 90° bends 104 that form a series of segments 108 that form and/or connect the fins 106. For example, vertical segments 110 for the fins 106 and horizontal segments 112 connect the fins 106 to define a channel 114 therebetween.

In some embodiments, the folded graphite sheet 102 is continuous between at least two fins 106. For example, the thermal management device 100 illustrated in FIG. 1 has a single folded graphite sheet 102 that is continuous through the segments 108 and plurality of fins 106 of the thermal management device 100. In some embodiments, the folded graphite sheet 102 is a graphite sheet with at least one continuous layer of graphite through a plurality of fins 106. In some embodiments, the folded graphite sheet 102 includes at least one continuous sheet of graphite through all of the fins 106 of the thermal management device 100. In some embodiments, the thermal management device 100 includes a plurality of folded graphite sheets 102. In some embodiments, a folded graphite sheet 102 of the thermal management device 100 is located within at least two fins 106.

In some embodiments, the thermal conductivity of graphite is greater in a plane when compared to conventional materials used in heatsinks. For example, the thermal conductivity of graphite in a sheet is at least 500 Watts per meter-Kelvin (W/m-K), while the thermal conductivity of a copper sheet is 400 W/m-K and the thermal conductivity of an aluminum sheet is 200 W/m-K. The planar thermal conductivity of graphite allows thermal conduction from the heat spreader 116 away from the heat spreader 116 to pass the heat into a fluid stream efficiently. The working fluid (such as a liquid or gaseous fluid) flows in the fluid stream in the channels 114 and around the fins 106 to allow for high thermal efficiency of the thermal management device 100.

In some embodiments, the heat spreader 116 is a solid fin of material or a plurality of pieces of material joined by welding, soldering, conductive adhesive, etc. In some embodiments, the heat spreader 116 is a vapor chamber that convectively moves heat through the heat spreader 116 using a working fluid. At a first interface of a vapor chamber a liquid working fluid in contact with a thermally conductive solid surface turns into a vapor phase of the working fluid by absorbing heat from that surface. The vapor working fluid then travels through an interior volume of the vapor chamber to a lower temperature second interface and condenses back into a liquid phase releasing the latent heat. The liquid working fluid then returns to the first interface through, for example, capillary action through a wicking structure, or gravity, and the cycle repeats. Due to the high heat transfer coefficients for boiling and condensation, vapor cooling system vapor chambers are effective thermal conductors similar to a heat pipe.

In some embodiments, using a thermal management device 100 in combination with a vapor chamber heat spreader 116, testing indicates support for cooling 600 W-1000 W server devices in smaller form factors than conventional heatsinks. Graphite is lighter than a metal sheet or foil of comparable thermal conductivity, providing additional weight and mechanical advantages over metal heatsinks, such as those including aluminum or copper. In some embodiments, the lower mass of graphite for a comparable thermal conductivity allows a lower mass thermal management device 100 that is less susceptible to damage from shock and vibration, such as during transport, during use, or during maintenance.

While FIG. 1 illustrates an embodiment of a thermal management device 100 with 90° bends 104, in other embodiments, the bends 104 and/or segments 108 have different shapes. In some embodiments, the bends 104 are continuous curves such that the fins 106 and/or vertical segments 110 are connected by continuous curves therebetween. In other words, the horizontal segments 112 are curved surfaces. In some embodiments, curved bends 104 can reduce stress risers and potential failure points for the thermal management device 100.

In some embodiments, the folded graphite sheet 102 of the thermal management device 100 is coupled to the heat spreader 116 by a thermally conductive adhesive. In some embodiments, the folded graphite sheet 102 of the thermal management device is coupled to the heat spreader 116 by bonding of the folded graphite sheet 102 directly to the heat spreader 116 without an intervening material therebetween. In some embodiments, a polymer component of the folded graphite sheet 102, as will be described in more detail herein, bonds the folded graphite sheet 102 to the heat spreader 116.

The thermal management device 100, according to some embodiments of the present disclosure, is thermally connected to a heat source 118, such as a processor, a storage device, a network device, a power source, or other components of an electronic device. In some embodiments, the heat source 118 is coupled directly to the thermal management device 100. In some embodiments, the heat source 118 is thermally connected to the thermal management device 100 with at least one thermally conductive or convective element therebetween.

A TIM 120 is located between the heat source 118 and the heat spreader 116 of the thermal management device 100, in some embodiments. The TIM 120 allows heat to flow efficiently between the heat source 118 and the heat spreader 116. The high planar thermal conductivity of the folded graphite sheet 102 of the thermal management device 100, in some embodiments, transfers the heat from the heat spreader 116 into the fins 106 and into the fluid flow through the channels 114 to exhaust the heat.

Figure 2:
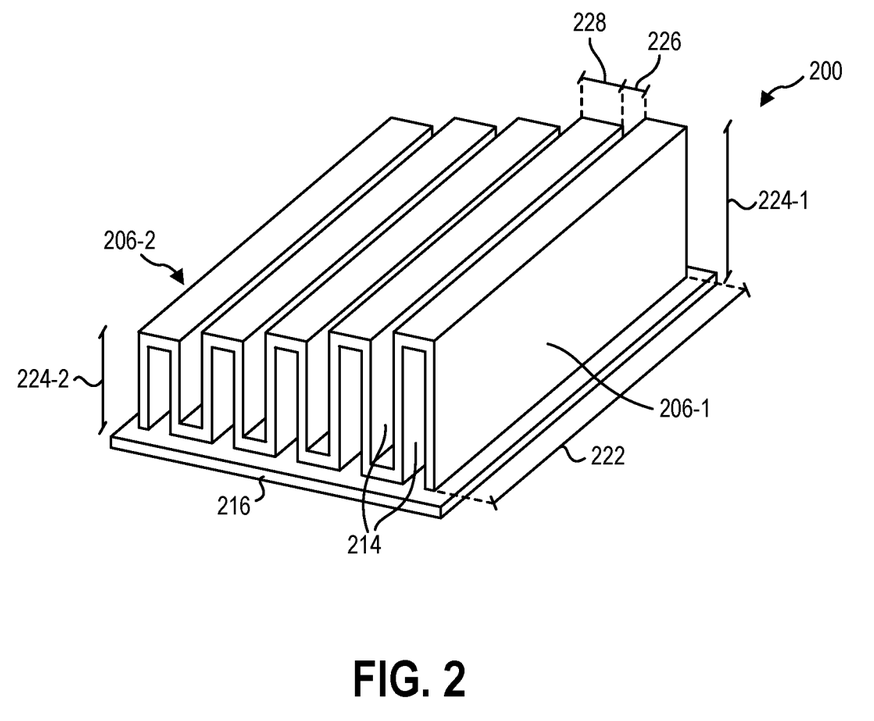
FIG. 2 is a perspective view of a thermal management device, according to at least one embodiment of the present disclosure.

FIG. 2 is a perspective view of another embodiment of a thermal management device 200. In some embodiments, the thermal management device 200 has a uniform structure with fins of uniform height and width and channels of uniform height and width, such as illustrated in FIG. 1. In some embodiments, a thermal management device 200, such as illustrated in FIG. 2, has a non-uniform structure.

In some embodiments, a first fin 206-1 and a second fin 206-2 of the thermal management device 200 have at least one different dimension. In some embodiments, the first fin 206-1 and the second fin 206-2 are part of a single folded graphite sheet, while in other embodiments, the first fin 206-1 and the second fin 206-2 are formed from different folded graphite sheets.

The geometry of fins 206-1, 206-2 of the thermal management device may vary in at least one dimension. In some embodiments, the thermal management device 200 has fins 206-1, 206-2 with a uniform length 222. In other embodiments, a first fin 206-1 has a different length 222 than that of a second fin 206-2.

In some embodiments, a height 224-1, 224-2 of a fin 206-1, 206-2 in a direction normal to the heat spreader 216 is uniform along the length 222 of the thermal management device 200. In some embodiments, a height 224-1, 224-2 of a fin 206-1, 206-2 varies along at least a portion of the length 222 of the thermal management device 200.

In some embodiments, a first fin 206-1 has a first height 224-1, and a second fin 206-2 has a second height 224-2 that is different from the first height 224-1. In some embodiments, at least two of the fins have the same height. In some embodiments, all of the fins have the same height. In some embodiments, all of the fins have different heights.

While the embodiment of a thermal management device 200 illustrated in FIG. 2 has uniform channel widths 226, in some embodiments, at least two channels 214 of the thermal management device 200 have with different channel widths 226. In some embodiments, the channel widths 226 vary at least partially based on a fin height 224-1, 224-2 of adjacent fins. For example, the channel width 226 and/or a horizontal segment width 228 varies based at least partially on a fin height 224-1, 224-2 of adjacent fins to provide a substantially consistent volume of the channels 214 to provide consistent cooling from different portions of the thermal management device 200.

Figure 3:
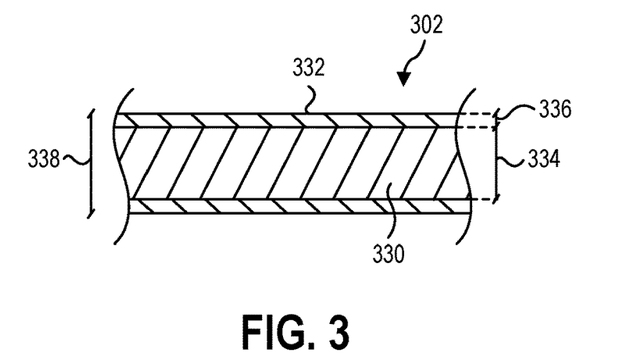
FIG. 3 is a side cross-sectional view of a graphite sheet, according to at least one embodiment of the present disclosure.

FIG. 3 is side cross-sectional view of an embodiment of an encapsulated graphite sheet 302. While FIG. 3 illustrates a portion of the graphite sheet 302 that is planar without a bend or curve (such as the bends 104 illustrated in FIG. 1), it should be understood that FIG. 3 and FIG. 4 may be cross-sectional areas of a portion of a folded graphite sheet (such as folded graphite sheet 102 illustrated in FIG. 1 and/or folded graphite sheet 202 illustrated in FIG. 2) and may be representative of a composition of a planar, bent, or curved portion of a graphite sheet 302.

In some embodiments, the graphite sheet 302 has a graphite core 330. The in-plane thermal conductivity of a graphite core 330 is greater than conventional material used in heat sinks, such as titanium, copper, aluminum, and alloys including those materials. In some embodiments, the graphite core 330 includes elongated graphite fibers and/or threads that provide an in-plane anisotropic thermal conductivity. In some embodiments, the graphite core 330 has a greatest thermal conductivity in a longitudinal direction of the graphite sheet 302 (e.g., in the direction of a fin height 224-1, 224-2 of a fin 206-1, 206-2 as described in relation to FIG. 2). In some embodiments, the graphite core 330 has a greatest thermal conductivity in a transverse direction of the graphite sheet 302 (e.g., in the direction of a length 222 of the thermal management device 200 as described in relation to FIG. 2).

In some embodiments, the graphite core 330 has an isotropic thermal conductivity within the plane of the graphite sheet 302. For example, the graphite core 330 may include a plurality of layers of graphite fibers oriented at an angle to one another. As each layer may have an in-plane anisotropic thermal conductivity, the bulk graphite core 330 including a plurality of layers may exhibit a substantially isotropic thermal conductivity. As described herein, in some embodiments, the thermal conductivity of graphite in at least one direction in the plane of the graphite sheet 302 is at least 500 W/m-K, while the thermal conductivity of a copper sheet is approximately 400 W/m-K and the thermal conductivity of an aluminum sheet is approximately 200 W/m-K.

In some embodiments, the graphite sheet 302 includes an encapsulant 332 on at least one surface of a graphite core 330. In some embodiments, the graphite sheet 302 includes an encapsulant 332 on an upper surface and an opposite lower surface. In some embodiments, the graphite sheet 302 includes an encapsulant 332 positioned on an outer surface of the graphite sheet 302.

The encapsulant 332, in some embodiments, electrically insulates the graphite core 330 to limit and/or prevent electrical shorts. For example, the encapsulant 332 may be an electrically insulating material and/or have a thickness sufficient to limit and/or prevent electrical shorts to the graphite core 330. In some embodiments, the encapsulant 332 allows thermal conductivity therethrough to allow the heat transferred through the graphite core 330 to be exhausted to a surrounding fluid, such as an immersion working fluid. In some embodiments, the encapsulant 332 includes or is a polymer. In some embodiments, the encapsulant 332 is chemically stable in an immersion working fluid.

The encapsulant 332 may be applied to the graphite core 330 in a variety of ways. In some embodiments, the encapsulant 332 is applied to the graphite core 330 through a deposition process. For example, the encapsulant 332 may be applied through a physical vapor deposition (PVD) process. In other examples, the encapsulant 332 may be applied through a chemical vapor deposition (CVD) process. In yet other examples, the encapsulant 332 may be applied through a liquid deposition process.

In some embodiments, the encapsulant 332 is elastically and/or plastically deformable to allow the graphite sheet 302 to bend, such as during forming of a folded graphite sheet (e.g., the folded graphite sheet 102, 202 described in relation to FIG. 1 and FIG. 2). In some embodiments, an elastic encapsulant 332 provides greater resistance to shock and vibration damage during transport or operation of a thermal management system.

In some embodiments, an elastically and/or plastically deformable encapsulant 332 is heated to relieve elastic stress in the encapsulant 332 after deformation of the graphite sheet 302. In some embodiments, the encapsulant 332 is heat-set after deformation of the graphite sheet 302 to aid in retaining the shape of the graphite sheet 302 after deformation.

In some embodiments, the graphite sheet 302 has a single graphite core 330 with a graphite core thickness 334. The encapsulant 332 has an encapsulant thickness 336 in a direction normal to an outer surface of the graphite core 330. In some embodiments, the encapsulant thickness 336 is at least 1 micrometer (µm). In some embodiments, the encapsulant thickness 336 is at least 5 µm. In some embodiments, the encapsulant thickness 336 is at least 10 µm. In some embodiments, the encapsulant thickness 336 is between 1 µm and 10 µm. Increasing encapsulant thickness 336 across reduces the thermal conductivity across the encapsulant 332 while increasing the electrical insulation and durability of the encapsulant 332. In some embodiments, the encapsulant 332 has a total thermal conductivity thereacross of at least 480 W/m-K and a total electrical conductivity of not more less than 6.8 kV.

The core thickness 334 may be selected based on thermal conductivity of the graphite core 330 and the thermal flux through the graphite core 330 to the surrounding working fluid. In some embodiments, the core thickness 334 is at least 15 µm. In some embodiments, the core thickness 334 is at least 25 µm. In some embodiments, the core thickness 334 is at least 50 µm. In some embodiments, the core thickness 334 is at least 100 µm. In some embodiments, the core thickness 334 is at least 500 µm. In some embodiments, the core thickness 334 is at least 1 millimeter. Increasing the core thickness 334 can increase thermal flux in the plane of the graphite core 330 and decrease the surface-to-volume ratio of the graphite core 330 to exhaust the heat to the surrounding working fluid.

In some embodiments, the encapsulant thickness 336 is based at least partially on the core thickness 334. For example, a thicker graphite core 330 may produce a greater strain on the encapsulant 332 when bent or curved to a desired shape. In some examples, a thicker graphite core 330 has more mass, which can produce greater shock and vibration forces during transport or operation. In some embodiments, an encapsulant thickness 336 that is at least partially relative to the core thickness 334 increases the operational lifetime of a thermal management device according to the present disclosure.

In some embodiments, an encapsulant ratio (i.e., encapsulant thickness 336 to core thickness 334) is between 2% and 50%. In some embodiments, an encapsulant ratio is between 5% and 40%. In some embodiments, an encapsulant ratio is between 10% and 25%. In at least one embodiment, an encapsulant ratio is approximately 20%.

The total thickness 338 of a graphite sheet 302 may include the core thickness 334 and the encapsulant thickness 336 of two layers of the encapsulant 332. In some embodiments, the total thickness 338 of the graphite sheet 302 is in a range having an upper value, a lower value, or upper and lower values including any of 25 µm, 50 µm, 75 µm, 100 µm, 250 µm, 500 µm, 1 mm, or any values therebetween. In some embodiments, the total thickness 338 is no less than 25 µm. In some embodiments, the total thickness 338 is no more than 1 mm. In some embodiments, the total thickness 338 is between 25 µm and 1 mm. In some embodiments, the total thickness 338 is between 35 µm and 500 µm. In some embodiments, the total thickness 338 is between 50 µm and 250 µm. In at least one embodiment, the total thickness 338 is approximately 100 µm.

Figure 41:
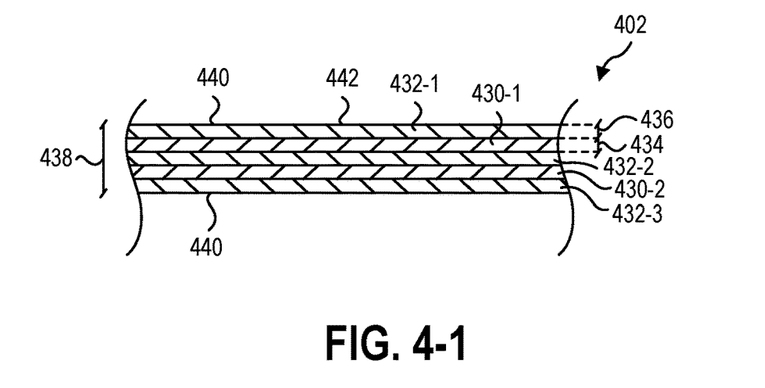

FIG. 4-1 is side cross-sectional view of multi-layer composite graphite sheet 402. A multi-layer composite graphite sheet 402 includes at least two graphite cores 430-2, 430-2 with at least one encapsulant layer 432-2 at least partially therebetween. In some embodiments, the at least one encapsulant layer 432-2 is partially therebetween with a portion of the first graphite core 430-1 contacting the second graphite core 430-2 to allow direct thermal and/or electrical conductivity between the graphite cores, as is described in greater detail herein.

In some embodiments, the total thickness 438 of the graphite sheet 402 is the same as a graphite sheet with a single graphite core (such as the graphite sheet 302 described in relation to FIG. 3). In some embodiments, the total thickness 438 of a multi-layer composite graphite sheet 402 is greater than a graphite sheet with a single graphite core, as the intermediate encapsulant layer(s) 432-2 allow for greater plastic and/or elastic deformation of the graphite sheet 402 without cracking, flaking, or damage to the graphite core or encapsulant relative to a graphite sheet with a single graphite core.

In some embodiments, the core thickness 434 of each graphite core 430-1, 430-2 of the graphite sheet 402 is the same as at least one other core thickness 434. In some embodiments, the core thickness 434 of a first graphite core 430-1 is different from a core thickness 434 of a second graphite core 430-2. In some embodiments, the core thickness 434 of each graphite core 430-1, 430-2 of the graphite sheet 402 is the different from each other core thickness 434. In some embodiments, the core thickness 434 of a graphite core 430-1, 430-2 is at least partially related to the proximity of the graphite core 430-1, 430-2 to an outer surface 440 of the graphite sheet 402. For example, a graphite core closer to an outer surface 440 of the graphite sheet may have a core thickness less than or greater than a core thickness of a graphite core further from the outer surface 440. In some embodiments, the core thickness 434 is at least partially related to the proximity of the graphite core 430-1, 430-2 to an upper surface 442 (e.g., the portion of the outer surface 440 away from the heat spreader, such as heat spreader 116 described in relation to FIG. 1) of the graphite sheet 402. For example, a graphite core closer to an upper surface 442 of the graphite sheet may have a core thickness less than or greater than a core thickness of a graphite core further from the upper surface 442. In some embodiments, a thin core thickness 434 near an upper surface 442 limits cracking, flaking, or other damage to the graphite sheet 402 in the event of damage or wear to the graphite sheet 402 proximate the upper surface 442.

In some embodiments, the encapsulant thickness 436 of each encapsulant layers 432-1, 432-2, 432-3 of the graphite sheet 402 is the same as at least one other core thickness 436. In some embodiments, the encapsulant thickness 436 of a first encapsulant layer 432-1 is different from an encapsulant thickness 436 of a second encapsulant layer 432-2. In some embodiments, the encapsulant thickness 436 of each encapsulant layer 432-1, 432-2, 432-3 of the graphite sheet 402 is the different from each other encapsulant thickness 436. In some embodiments, the encapsulant thickness 436 of an encapsulant layer 432-1, 432-2, 432-3 is at least partially related to the proximity of the encapsulant layer 432-1, 432-2, 432-3 to an outer surface 440 of the graphite sheet 402. For example, encapsulant layer 432-1, 432-2, 432-3 closer to an outer surface 440 of the graphite sheet 402 may have an encapsulant thickness 436 less than or greater than an encapsulant thickness 436 of an encapsulant layer 432-1, 432-2, 432-3 further from the outer surface 440. In some embodiments, the encapsulant thickness 436 is at least partially related to the proximity of the encapsulant layer 432-1, 432-2, 432-3 to an upper surface 442 of the graphite sheet 402. For example, an encapsulant layer 432-1, 432-2, 432-3 closer to an upper surface 442 of the graphite sheet 402 may have an encapsulant thickness 436 less than or greater than an encapsulant thickness 436 of an encapsulant layer 432-1, 432-2, 432-3 further from the upper surface 442. In some embodiments, a thicker encapsulant thickness 436 near an upper surface 442 limits cracking, flaking, or other damage to the graphite sheet 402 in the event of damage or wear to the graphite sheet 402 proximate the upper surface 442.

FIG. 4-2 is a flowchart illustrating an embodiment of a method of manufacturing a folded graphite sheet (such as the folded graphite sheets 102, 202 of FIG. 1 and FIG. 2. In some embodiments, the method 441 includes obtaining a graphite sheet (a single core graphite sheet such as described in relation to FIG. 3 or a graphite sheet with a plurality of graphite cores such as described in relation to FIG. 4-1) and forming a bend in the graphite sheet at 443. As described herein, a forming the bend in the graphite sheet may introduce elastic stress into at least one encapsulant layer of the graphite sheet. In some embodiments, the encapsulant layer is an outer layer of the encapsulant. In some embodiments, the encapsulant layer is an intermediate encapsulant layer between graphite cores.

Figure 42:
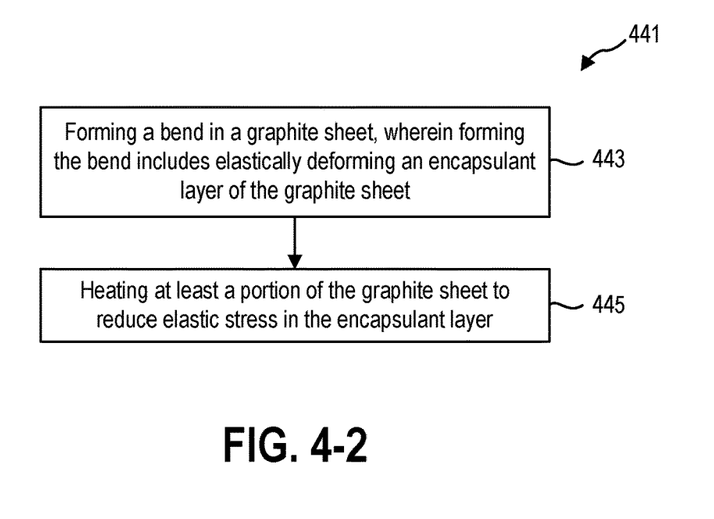

In some embodiments, the method 441 further includes heating at least a portion of the graphite sheet to reduce elastic stress in the encapsulant layer at 445. Heating at least a portion of the graphite sheet may include heating the entire graphite sheet. In some embodiments, heating at least a portion of the graphite sheet includes heating less than the entire graphite sheet. In at least one embodiment, heating at least a portion of the graphite sheet includes heating only the bend(s) of the graphite sheet. In some embodiments, heating at least a portion of the graphite sheet includes heating the encapsulant above a melting temperature. In some embodiments, heating at least a portion of the graphite sheet includes heating the encapsulant above a glass transition temperature.

Figure 51:
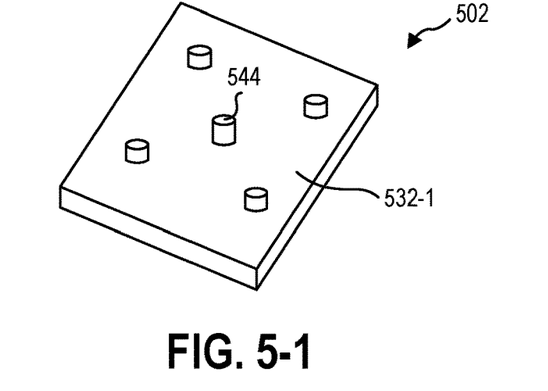
Figure 52:
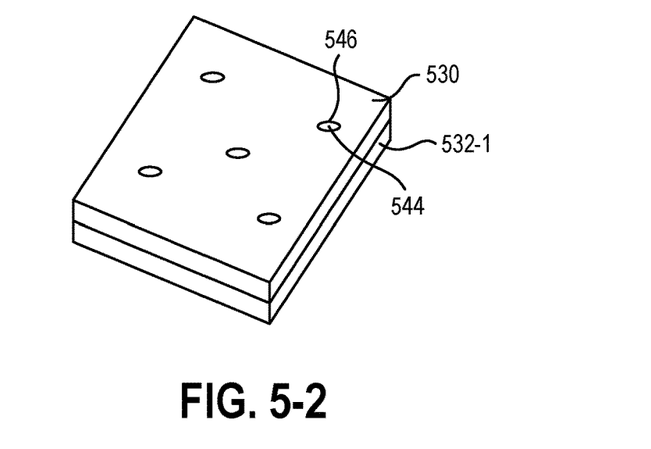
Figure 53:
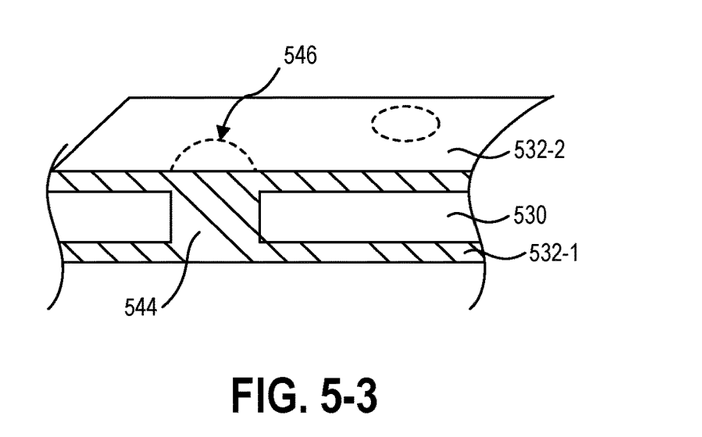

FIG. 5-1 through FIG. 5-3 illustrate different views of an embodiment of a graphite sheet 502 with encapsulant posts 544 through a graphite core to help retain the encapsulant on the graphite core. FIG. 5-1 is a perspective view of a first encapsulant layer 532-1 with at least one encapsulant post 544 protruding from a body 546 of the first encapsulant layer 532-1 toward a graphite sheet 530 (shown in FIG. 5-2) with corresponding post holes 546 therein. In some embodiments, the encapsulant post(s) 544 provide a contact through the graphite sheet 530 to a second encapsulant layer 532-2 opposite the first encapsulant layer 532-1. The encapsulant posts 544 may bond the second encapsulant layer 532-2 to the first encapsulant layer 532-1 to reduce and/or prevent delamination of the encapsulant layers 532-1, 532-2, such as illustrated in FIG. 5-3. In some embodiments, the second encapsulant layer 532-2 is similarly coupled or bonded to further encapsulant layers opposite further graphite cores in a multi-layer composite graphite sheet.

In some embodiments, an encapsulant post 544 is formed from the same material as the encapsulant layer and/or is integrally formed with the encapsulant layer. In some embodiments, the encapsulant post 544 is formed from a different material as the encapsulant layer and/or is bonded or adhered to the encapsulant layer. For example, an encapsulant post 544 may be positioned in the post hole 546 of a graphite core 530 and the encapsulant layers 532-1, 532-2 may be subsequently applied to opposite sides of the graphite core 530 and bonded to the encapsulant post 544.

Figure 6:
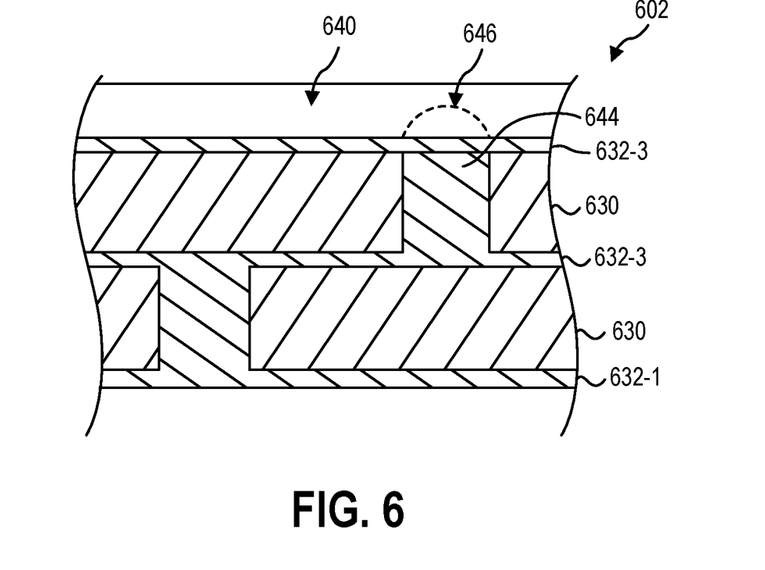
FIG. 6 is a side cross-sectional view of a multi-layer graphite sheet with encapsulant posts, according to at least one embodiment of the present disclosure.

FIG. 6 is a side cross-sectional view of a multi-layer composite graphite sheet 602 that includes a plurality of graphite cores 630-1, 630-2 with post holes 646 therethrough. In some embodiments, at least one post hole 646 is axially aligned with another post hole 646 such that an encapsulant post 644 is substantially continuous through the graphite cores 630-1, 630-2 between the outer surfaces 640 of the graphite sheet 602. In some embodiments, at least one post hole 646 is axially misaligned (such as illustrated in FIG. 6) with another post hole 646 to distribute the post holes 646 and encapsulant posts 644 within the graphite sheet 602. In at least one embodiment, distributing the post holes 646 and encapsulant posts 644 within the graphite sheet 602 increasing the homogeneity of the thermal conductivity of the graphite sheet 602.

Figure 7:
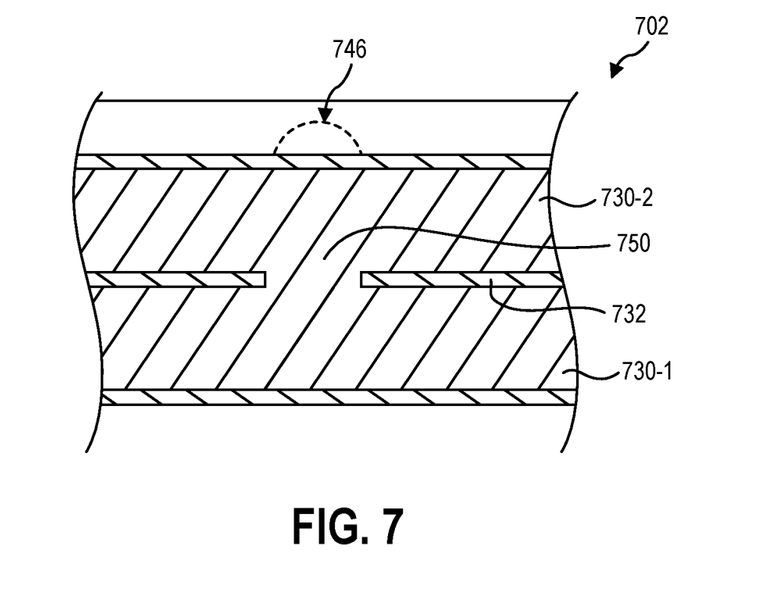
FIG. 7 is a side cross-sectional view of a multi-layer graphite sheet with graphite posts, according to at least one embodiment of the present disclosure.

FIG. 7 is a side cross-sectional view of another embodiment of a multi-layer composite graphite sheet 702. In some embodiments, at least one encapsulant layer 732 includes a post hole 746 through which a graphite post 750 couples a first graphite core 730-1 to a second graphite core 730-2. In some embodiments, a graphite post 750 is integrally formed with the first graphite core 730-1 and the second graphite core 730-2. In some embodiments, a graphite post 750 is integrally formed with one of the first graphite core 730-1 and the second graphite core 730-2. In some embodiments, the graphite post 750 is formed from a different piece of graphite as the graphite cores and/or is bonded or adhered to the graphite cores 730-1, 730-2. For example, a graphite post 750 may be positioned in the post hole 746 of an encapsulant layer 732, and a graphite core 730-1, 730-2 may be subsequently applied to the encapsulant layer 732 and bonded to the graphite post 750.

In other embodiments, the graphite post 750 is integrally formed with a graphite core 730-1, 730-2. For example, the graphite core 730-1, 730-2 including a graphite post 750 may be milled from a larger graphite blank, or a graphite core 730-1, 730-2 including a graphite post 750 may be molded, sintered, or pressed from a graphite powder.

In simulations comparing an embodiment of a thermal management device using a graphite sheet according to the present disclosure to a conventional thermal management device using a metal foil, improvements of approximately five times the fin efficiency were calculated. A simulated heat source was provided at a constant heat generation of 100 W to a thermal management device with a folded graphite sheet (such as the folded graphite sheet 100 of FIG. 1). The folded graphite sheet included continuous graphite cores through a series of eight fins having a fin height of 28 mm and a fin length of 50 mm. The folded graphite sheet had a width (transverse to both the length and height) of 100 mm. The graphite sheet was approximated to have a thermal conductivity in-plane of 500 W/m-K and a total thickness of 76 μm. The encapsulation layer included a polymide vinyl with a thermal conductivity of 0.4 W/m-K. The simulation was compared against a thermal management device using a folded graphite sheet (to ensure comparable surface area) of aluminum with a thermal conductivity approximated to be 200 W/m-K. The graphite fin, simulated in with air as the surrounding fluid into which the heat is exhausted, was simulated to exhaust heat with a fin efficiency value approximately 3.8 time greater than an aluminum-based thermal management device.

INDUSTRIAL APPLICABILITY

The present disclosure relates generally to systems and methods for thermal management. More particularly, the thermal management devices described herein are configured to provide improved thermal conductivity in a variety of environments. In some embodiments, a thermal management device is positioned on a heat spreader to receive heat from a computing component of the electronic device. In some examples, the computing component, such as a processor, system memory, hardware storage device, networking device, etc. is located in a small volume of available air flow or fluid flow to exhaust the heat, such as in server racks or portable personal computing devices (e.g., smartphone, head-mounted device, laptop computer, tablet computer, hybrid computer). A thermal management device according to the present disclosure includes graphite sheets at least partially covered by an encapsulant to increase the operational lifetime of the thermal management device and allow use in a variety of environments.

In some embodiments, a thermal management device according to the present disclosure is thermally connected to a heat spreader, which receives heat from at least one heat source in the electronic device. In some embodiments, the heat source is a processor, such as a central processing unit (CPU), a graphical processing unit (GPU); a storage device, such as random-access memory (RAM), other volatile memory, non-volatile memory, or combinations thereof; a network device; a power source; or other components of the electronic device. In some embodiments, the heat source is coupled directly to the thermal management device. In some embodiments, the heat source is thermally connected to the thermal management device with at least one thermally conductive or convective element therebetween.

In some examples, the heat source is thermally connected to the thermal management device by a thermal interface material (TIM), such as a thermal paste, sandwiched between a surface of the heat source and a surface of the thermal management device. In some examples, the heat source is thermally connected to the thermal management device by a heat pipe, vapor chamber, heat spreader, or other thermally conductive or convective element that transports heat from a surface of the heat source to a surface of the thermal management device. The thermal management device is thermally connected to the heat source when at least one element of a thermal management system is intended to physically connect the thermal management device to the heat source. In other words, a thermal management device that receives heat from the heat source only by ambient air flowing therebetween is not thermally connected, while a thermal management device connected to a heat source by a vapor chamber with a two-phase working fluid moving therein is thermally connected when a surface of the vapor chamber contacts a surface of the heat source and a surface of the thermal management device. In another example, a thermal management device is thermally connected to the heat source when the heat source is in contact with a first TIM, which contacts a surface of a heat pipe, which contacts a second TIM, which contacts a surface of the thermal management device.

In some embodiments, the thermal management device includes a folded graphite sheet of graphite composite. The folded graphite sheet includes at least one bend in the sheet to create a plurality of fins. In some embodiments, the bends are substantially discontinuous corners, such as 90° bends that form a series of segments that form and/or connect the fins. For example, vertical segments for the fins and horizontal segments connect the fins to define a channel therebetween.

In some embodiments, the folded graphite sheet is continuous between at least two fins 106. For example, the thermal management device has a single folded graphite sheet that is continuous through the segments and plurality of fins of the thermal management device. In some embodiments, the folded graphite sheet is a graphite sheet with at least one continuous layer of graphite through a plurality of fins. In some embodiments, the folded graphite sheet includes at least one continuous sheet of graphite through all of the fins of the thermal management device. In some embodiments, the thermal management device includes a plurality of folded graphite sheets. In some embodiments, a folded graphite sheet of the thermal management device is located within at least two fins.

In some embodiments, the thermal conductivity of graphite is greater in a plane when compared to conventional materials used in heatsinks. For example, the thermal conductivity of graphite in a sheet is at least 500 Watts per meter-Kelvin (W/m-K) and up to or greater than 1000 W/m-K, while the thermal conductivity of a copper sheet is 400 W/m-K and the thermal conductivity of an aluminum sheet is 200 W/m-K. The planar thermal conductivity of graphite allows thermal conduction from the heat spreader away from the heat spreader to pass the heat into a fluid stream efficiently. The working fluid (such as a liquid or gaseous fluid) flows in the fluid stream in the channels and around the fins to allow for high thermal efficiency of the thermal management device.

In some embodiments, the heat spreader is a solid fin of material or a plurality of pieces of material joined by welding, soldering, conductive adhesive, etc. In some embodiments, the heat spreader is a vapor chamber that convectively moves heat through the heat spreader using a working fluid. At a first interface of a vapor chamber a liquid working fluid in contact with a thermally conductive solid surface turns into a vapor phase of the working fluid by absorbing heat from that surface. The vapor working fluid then travels through an interior volume of the vapor chamber to a lower temperature second interface and condenses back into a liquid phase releasing the latent heat. The liquid working fluid then returns to the first interface through, for example, capillary action through a wicking structure, or gravity, and the cycle repeats. Due to the high heat transfer coefficients for boiling and condensation, vapor cooling system vapor chambers are effective thermal conductors similar to a heat pipe.

In some embodiments, using a thermal management device 100 in combination with a vapor chamber heat spreader, testing indicates support for cooling 600 W-1000 W server devices in smaller form factors than conventional heatsinks. Graphite is lighter than a metal sheet or foil of comparable thermal conductivity, providing additional weight and mechanical advantages over metal heatsinks, such as those including aluminum or copper. In some embodiments, the lower mass of graphite for a comparable thermal conductivity allows a lower mass thermal management device that is less susceptible to damage from shock and vibration, such as during transport, during use, or during maintenance.

In some embodiments, a folded graphite sheet has 90° bends, in other embodiments, the bends and/or segments have different shapes. In some embodiments, the bends are continuous curves such that the fins and/or vertical segments are connected by continuous curves therebetween. In other words, the horizontal segments are curved surfaces. In some embodiments, curved bends can reduce stress risers and potential failure points for the thermal management device.

In some embodiments, the folded graphite sheet of the thermal management device is coupled to the heat spreader by a thermally conductive adhesive. In some embodiments, the folded graphite sheet of the thermal management device is coupled to the heat spreader by bonding of the folded graphite sheet directly to the heat spreader without an intervening material therebetween. In some embodiments, a polymer component or encapsulant of the folded graphite sheet, as will be described in more detail herein, bonds the folded graphite sheet to the heat spreader.

The thermal management device, according to some embodiments of the present disclosure, is thermally connected to a heat source, such as a processor, a storage device, a network device, a power source, or other components of an electronic device. In some embodiments, the heat source is coupled directly to the thermal management device. In some embodiments, the heat source is thermally connected to the thermal management device with at least one thermally conductive or convective element therebetween.

A TIM is located between the heat source and the heat spreader of the thermal management device, in some embodiments. The TIM allows heat to flow efficiently between the heat source and the heat spreader. The high planar thermal conductivity of the folded graphite sheet of the thermal management device, in some embodiments, transfers the heat from the heat spreader into the fins and into the fluid flow through the channels to exhaust the heat.

In some embodiments, the thermal management device has a uniform structure with fins of uniform height and width and channels of uniform height and width. In some embodiments, a thermal management device has a non-uniform structure.

In some embodiments, a first fin and a second fin of the thermal management device have at least one different dimension. In some embodiments, the first fin and the second fin are part of a single folded graphite sheet, while in other embodiments, the first fin and the second fin are formed from different folded graphite sheets.

The geometry of fins of the thermal management device may vary in at least one dimension. In some embodiments, the thermal management device has fins with a uniform length. In other embodiments, a first fin has a different length than that of a second fin.

In some embodiments, a height of a fin in a direction normal to the heat spreader is uniform along the length of the thermal management device. In some embodiments, a height of a fin varies along at least a portion of the length of the thermal management device.

In some embodiments, a first fin has a first height, and a second fin has a second height that is different from the first height. In some embodiments, at least two of the fins have the same height. In some embodiments, all of the fins have the same height. In some embodiments, all of the fins have different heights.

In some embodiments, a thermal management device has uniform channel widths, and in some embodiments, at least two channels of the thermal management device have with different channel widths. In some embodiments, the channel widths vary at least partially based on a fin height of adjacent fins. For example, the channel width and/or a horizontal segment width varies based at least partially on a fin height of adjacent fins to provide a substantially consistent volume of the channels to provide consistent cooling from different portions of the thermal management device.

In some embodiments, the graphite sheet has a graphite core. The in-plane thermal conductivity of a graphite core is greater than conventional material used in heat sinks, such as titanium, copper, aluminum, and alloys including those materials. In some embodiments, the graphite core includes elongated graphite fibers and/or threads that provide an in-plane anisotropic thermal conductivity. In some embodiments, the graphite core has a greatest thermal conductivity in a longitudinal direction of the graphite sheet (e.g., in the direction of a fin height of a fin as described herein). In some embodiments, the graphite core has a greatest thermal conductivity in a transverse direction of the graphite sheet (e.g., in the direction of a length of the thermal management device as described herein).

In some embodiments, the graphite core has an isotropic thermal conductivity within the plane of the graphite sheet. For example, the graphite core may include a plurality of layers of graphite fibers oriented at an angle to one another. As each layer may have an in-plane anisotropic thermal conductivity, the bulk graphite core including a plurality of layers may exhibit a substantially isotropic thermal conductivity. As described herein, in some embodiments, the thermal conductivity of graphite in at least one direction in the plane of the graphite sheet is at least 500 W/m-K, while the thermal conductivity of a copper sheet is approximately 400 W/m-K and the thermal conductivity of an aluminum sheet is approximately 200 W/m-K.

In some embodiments, the graphite sheet includes an encapsulant on at least one surface of a graphite core. In some embodiments, the graphite sheet includes an encapsulant on an upper surface and an opposite lower surface. In some embodiments, the graphite sheet includes an encapsulant positioned on an outer surface of the graphite sheet.

The encapsulant, in some embodiments, electrically insulates the graphite core to limit and/or prevent electrical shorts. For example, the encapsulant may be an electrically insulating material and/or have a thickness sufficient to limit and/or prevent electrical shorts to the graphite core. In some embodiments, the encapsulant allows thermal conductivity therethrough to allow the heat transferred through the graphite core to be exhausted to a surrounding fluid, such as an immersion working fluid. In some embodiments, the encapsulant includes or is a polymer. In some embodiments, the encapsulant is chemically stable in an immersion working fluid.

The encapsulant may be applied to the graphite core in a variety of ways. In some embodiments, the encapsulant is applied to the graphite core through a deposition process. For example, the encapsulant may be applied through a physical vapor deposition (PVD) process. In other examples, the encapsulant may be applied through a chemical vapor deposition (CVD) process. In yet other examples, the encapsulant may be applied through a liquid deposition process.

In some embodiments, the encapsulant is elastically and/or plastically deformable to allow the graphite sheet to bend, such as during forming of a folded graphite sheet (e.g., the folded graphite sheet described herein). In some embodiments, an elastic encapsulant provides greater resistance to shock and vibration damage during transport or operation of a thermal management system.

In some embodiments, an elastically and/or plastically deformable encapsulant is heated to relieve elastic stress in the encapsulant after deformation of the graphite sheet. In some embodiments, the encapsulant is heat-set after deformation of the graphite sheet to aid in retaining the shape of the graphite sheet after deformation.

In some embodiments, the graphite sheet has a single graphite core with a graphite core thickness. The encapsulant has a encapsulant thickness in a direction normal to an outer surface of the graphite core. In some embodiments, the encapsulant thickness is at least 1 micrometer (μm). In some embodiments, the encapsulant thickness is at least 5 μm. In some embodiments, the encapsulant thickness is at least 10 µm. Increasing encapsulant thickness across the reduces the thermal conductivity across the encapsulant while increasing the electrical insulation and durability of the encapsulant. In some embodiments, the encapsulant has a total thermal conductivity thereacross of at least 480 W/m-K and a total electrical conductivity of not more less than 6.8 kV.

The core thickness may be selected based on thermal conductivity of the graphite core and the thermal flux through the graphite core to the surrounding working fluid. In some embodiments, the core thickness is at least 15 µm. In some embodiments, the encapsulant thickness is at least 25 µm. In some embodiments, the core thickness is at least 50 µm. In some embodiments, the core thickness is at least 100 µm. In some embodiments, the core thickness is at least 500 µm. In some embodiments, the core thickness is at least 1 millimeter. Increasing the core thickness can increase thermal flux in the plane of the graphite core and decrease the surface-to-volume ratio of the graphite core to exhaust the heat to the surrounding working fluid.

In some embodiments, the encapsulant thickness is based at least partially on the core thickness. For example, a thicker graphite core may produce a greater strain on the encapsulant when bent or curved to a desired shape. In some examples, a thicker graphite core has more mass, which can produce greater shock and vibration forces during transport or operation. In some embodiments, an encapsulant thickness that is at least partially relative to the core thickness increases the operational lifetime of a thermal management device according to the present disclosure.

In some embodiments, an encapsulant ratio (i.e., encapsulant thickness to core thickness) is between 2% and 50%. In some embodiments, an encapsulant ratio is between 5% and 40%. In some embodiments, an encapsulant ratio is between 10% and 25%. In at least one embodiment, an encapsulant ratio is approximately 20%.

The total thickness of a graphite sheet may include the core thickness and the encapsulant thickness of two layers of the encapsulant. In some embodiments, the total thickness of the graphite sheet is in a range having an upper value, a lower value, or upper and lower values including any of 25 µm, 50 µm, 75 µm, 100 µm, 250 µm, 500 µm, 1 mm, or any values therebetween. In some embodiments, the total thickness is no less than 25 µm. In some embodiments, the total thickness is no more than 1 mm. In some embodiments, the total thickness is between 25 µm and 1 mm. In some embodiments, the total thickness is between 35 µm and 500 µm. In some embodiments, the total thickness is between 50 µm and 250 µm. In at least one embodiment, the total thickness is approximately 100 µm.

In some embodiments, a multi-layer composite graphite sheet includes at least two graphite cores with at least one encapsulant layer at least partially therebetween. In some embodiments, the at least one encapsulant layer is partially therebetween with a portion of the first graphite core contacting the second graphite core to allow direct thermal and/or electrical conductivity between the graphite cores, as is described in greater detail herein.

In some embodiments, the total thickness of the multi-layer composite graphite sheet is the same as a graphite sheet with a single graphite core (such as the graphite sheet described above). In some embodiments, the total thickness of a multi-layer composite graphite sheet is greater than a graphite sheet with a single graphite core, as the intermediate encapsulant layer(s) allow for greater plastic and/or elastic deformation of the graphite sheet without cracking, flaking, or damage to the graphite core or encapsulant relative to a graphite sheet with a single graphite core.

In some embodiments, the core thickness of each graphite core of the graphite sheet is the same as at least one other core thickness. In some embodiments, the core thickness of a first graphite core is different from a core thickness of a second graphite core. In some embodiments, the core thickness of each graphite core of the graphite sheet is the different from each other core thickness. In some embodiments, the core thickness of a graphite core is at least partially related to the proximity of the graphite core to an outer surface of the graphite sheet. For example, a graphite core closer to an outer surface of the graphite sheet may have a core thickness less than or greater than a core thickness of a graphite core further from the outer surface. In some embodiments, the core thickness is at least partially related to the proximity of the graphite core to an upper surface (e.g., the portion of the outer surface away from the heat spreader, such as heat spreader described herein) of the graphite sheet. For example, a graphite core closer to an upper surface of the graphite sheet may have a core thickness less than or greater than a core thickness of a graphite core further from the upper surface. In some embodiments, a thin core thickness near an upper surface limits cracking, flaking, or other damage to the graphite sheet in the event of damage or wear to the graphite sheet proximate the upper surface.

In some embodiments, the encapsulant thickness of each encapsulant layers of the graphite sheet is the same as at least one other core thickness. In some embodiments, the encapsulant thickness of a first encapsulant layer is different from an encapsulant thickness of a second encapsulant layer. In some embodiments, the encapsulant thickness of each encapsulant layer of the graphite sheet is the different from each other encapsulant thickness. In some embodiments, the encapsulant thickness of an encapsulant layer is at least partially related to the proximity of the encapsulant layer to an outer surface of the graphite sheet. For example, encapsulant layer closer to an outer surface of the graphite sheet may have an encapsulant thickness less than or greater than an encapsulant thickness of an encapsulant layer further from the outer surface. In some embodiments, the encapsulant thickness is at least partially related to the proximity of the encapsulant layer to an upper surface of the graphite sheet. For example, an encapsulant layer closer to an upper surface of the graphite sheet may have an encapsulant thickness less than or greater than an encapsulant thickness of an encapsulant layer further from the upper surface. In some embodiments, a thicker encapsulant thickness near an upper surface limits cracking, flaking, or other damage to the graphite sheet in the event of damage or wear to the graphite sheet proximate the upper surface.

In some embodiments, a method of manufacturing a folded graphite sheet includes obtaining a graphite sheet (a single core graphite sheet or a graphite sheet with a plurality of graphite cores) and forming a bend in the graphite sheet. As described herein, a forming the bend in the graphite sheet may introduce elastic stress into at least one encapsulant layer of the graphite sheet. In some embodiments, the encapsulant layer is an outer layer of the encapsulant. In some embodiments, the encapsulant layer is an intermediate encapsulant layer between graphite cores.

In some embodiments, the method further includes heating at least a portion of the graphite sheet to reduce elastic stress in the encapsulant layer. Heating at least a portion of the graphite sheet may include heating the entire graphite sheet. In some embodiments, heating at least a portion of the graphite sheet includes heating less than the entire graphite sheet. In at least one embodiment, heating at least a portion of the graphite sheet includes heating only the bend(s) of the graphite sheet. In some embodiments, heating at least a portion of the graphite sheet includes heating the encapsulant above a melting temperature. In some embodiments, heating at least a portion of the graphite sheet includes heating the encapsulant above a glass transition temperature.

In some embodiments, a first encapsulant layer has at least one encapsulant post protruding from a body of the first encapsulant layer toward a graphite sheet with corresponding post holes therein. In some embodiments, the encapsulant post(s) provide a contact through the graphite sheet to a second encapsulant layer opposite the first encapsulant layer. The encapsulant posts may bond the second encapsulant layer to the first encapsulant layer to reduce and/or prevent delamination of the encapsulant layers. In some embodiments, the second encapsulant layer is similarly coupled or bonded to further encapsulant layers opposite further graphite cores in a multi-layer composite graphite sheet.

In some embodiments, an encapsulant post is formed from the same material as the encapsulant layer and/or is integrally formed with the encapsulant layer. In some embodiments, the encapsulant post is formed from a different material as the encapsulant layer and/or is bonded or adhered to the encapsulant layer. For example, an encapsulant post may be positioned in the post hole of a graphite core and the encapsulant layers may be subsequently applied to opposite sides of the graphite core and bonded to the encapsulant post.

In some embodiments, a multi-layer composite graphite sheet includes a plurality of graphite cores with post holes therethrough. In some embodiments, at least one post hole is axially aligned with another post hole such that an encapsulant post is substantially continuous through the graphite cores between the outer surfaces of the graphite sheet. In some embodiments, at least one post hole is axially misaligned with another post hole to distribute the post holes and encapsulant posts within the graphite sheet. In at least one embodiment, distributing the post holes and encapsulant posts within the graphite sheet increasing the homogeneity of the thermal conductivity of the graphite sheet.

In some embodiments, at least one encapsulant layer includes a post hole through which a graphite post couples a first graphite core to a second graphite core. In some embodiments, a graphite post is integrally formed with the first graphite core and the second graphite core. In some embodiments, a graphite post is integrally formed with one of the first graphite core and the second graphite core. In some embodiments, the graphite post is formed from a different piece of graphite as the graphite cores and/or is bonded or adhered to the graphite cores. For example, a graphite post may be positioned in the post hole of an encapsulant layer, and a graphite core may be subsequently applied to the encapsulant layer and bonded to the graphite post.

In other embodiments, the graphite post is integrally formed with a graphite core. For example, the graphite core including a graphite post may be milled from a larger graphite blank, or a graphite core including a graphite post may be molded, sintered, or pressed from a graphite powder.

The present disclosure relates to systems and methods for thermal management according to at least the examples provided in the sections below:

[A1] In some embodiments, a thermal management device includes a heat spreader and a folded graphite sheet. The heat spreader is configured to receive heat from a heat source. The folded graphite sheet is connected to the heat spreader to receive and exhaust heat from the heat spreader. The folded graphite sheet includes a first fin, a second fin, and a segment connecting the first fin and second fin. The first fin is oriented at least partially vertically away from the heat spreader. The second fin is oriented at least partially vertically away from the heat spreader. The folded graphite sheet is continuous through the first fin, the segment, and the second fin.

[A2] In some embodiments, the folded graphite sheet of [A1] includes an encapsulant on at least one surface of a graphite core.

[A3] In some embodiments, the folded graphite sheet of [A1] includes an encapsulant on all outer surfaces of a graphite core.

[A4] In some embodiments, the folded graphite sheet of [A1] includes a plurality of graphite cores.

[A5] In some embodiments, the folded graphite sheet of [A1] includes an intermediate encapsulant layer between a first graphite core and a second graphite core.

[A6] In some embodiments, the folded graphite sheet of any of [A1] through [A5] includes a first encapsulant layer and a second encapsulant layer connected by an encapsulant post in a post hole through a graphite core.

[A7] In some embodiments, the heat spreader, the first fin, the segment, and the second fin of any of [A1] through [A6] define a channel through which a working fluid can flow.

[A8] In some embodiments, the folded graphite sheet of any of [A1] through [A5] includes a bend between the first fin and the segment.

[A9] In some embodiments, the bend of [A8] is a 90° bend.

[A10] In some embodiments, the folded graphite sheet of any of [A1] through [A9] has a total thickness between 25 micrometers (μm) and 1 millimeter (mm).

[A11] In some embodiments, the folded graphite sheet of any of [A1] through [A10] has an encapsulant thickness between 1 μm and 10 μm.

[A12] In some embodiments, the folded graphite sheet of any of [A1] through [A11] has a core thickness between 25 μm and 1 mm.

[A13] In some embodiments, the folded graphite sheet of any of [A1] through [A12] has a first encapsulant layer and a second encapsulant layer, and the first encapsulant layer has a first encapsulant thickness that is different from a second encapsulant thickness of the second encapsulant layer.

[A14] In some embodiments, the folded graphite sheet of any of [A1] through [A13] has a first graphite core and a second graphite core, and the first graphite core has a first core thickness that is different from a second core thickness of the second graphite core.

[A15] In some embodiments, the folded graphite sheet of any of [A1] through [A14] has a graphite core with an in-plane thermal conductivity of at least 500 W/m-K.

[B1] In some embodiments, a thermal management device includes a folded graphite sheet configured to receive and exhaust heat from a heat source. The folded graphite sheet includes a graphite core and an encapsulant on an outer surface of the graphite core, and the encapsulant is an electrically insulating material.

[B2] In some embodiments, the graphite core of [B1] has an in-plane anisotropic thermal conductivity.

[B3] In some embodiments, the encapsulant of [B1] or [B2] has an encapsulant thickness and the graphite core of

[B1] or [B2] has a core thickness, and the encapsulant thickness and core thickness are in an encapsulant ratio between 2% and 50%.

[B4] In some embodiments, the folded graphite sheet of any of [B1] through [B3] includes an intermediate encapsulant layer between a first graphite core and a second graphite core that electrically insulates the first graphite core from the second graphite core.

[C1] In some embodiments, a method of manufacturing a thermal management device includes forming a bend in a graphite sheet, wherein forming the bend includes elastically deforming an encapsulant layer of the graphite sheet; and heating at least a portion of the graphite sheet to reduce elastic stress in the encapsulant layer.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management device comprising:
    a heat spreader configured to receive heat from a heat source; and
    a folded graphite sheet connected to the heat spreader to receive and exhaust heat from the heat spreader, wherein the folded graphite sheet includes a plurality of graphite cores, the folded graphite sheet including:
        a first fin oriented at least partially vertically away from the heat spreader,
        a second fin oriented at least partially vertically away from the heat spreader, and
        a segment connecting the first fin and second fin, wherein the folded graphite sheet is continuous through the first fin, the segment, and the second fin.

2. The thermal management device of claim 1, wherein the folded graphite sheet includes an encapsulant on at least one surface of a graphite core of the plurality of graphite cores.

3. The thermal management device of claim 1, wherein the folded graphite sheet includes an encapsulant on all outer surfaces of a graphite core of the plurality of graphite cores.

4. The thermal management device of claim 1, wherein the folded graphite sheet includes an intermediate encapsulant layer between a first graphite core and a second graphite core of the plurality of graphite cores.

5. The thermal management device of claim 1, wherein the folded graphite sheet includes a first encapsulant layer and a second encapsulant layer connected by an encapsulant post in a post hole through a graphite core of the plurality of graphite cores.

6. The thermal management device of claim 1, wherein the heat spreader, the first fin, the segment, and the second fin define a channel through which a working fluid can flow.

7. The thermal management device of claim 1, wherein the folded graphite sheet further comprises a bend between the first fin and the segment.

8. The thermal management device of claim 7, wherein the bend is a 90° bend.

9. The thermal management device of claim 1, wherein the folded graphite sheet has a total thickness between 25 micrometers (μm) and 1 millimeter (mm).

10. The thermal management device of claim 1, wherein the folded graphite sheet has an encapsulant thickness between 1 μm and 10 μm.

11. The thermal management device of claim 1, wherein at least one graphite core of the plurality of graphite cores of the folded graphite sheet has a core thickness between 25 μm and 1 mm.

12. The thermal management device of claim 1, wherein the folded graphite sheet includes a first encapsulant layer and a second encapsulant layer, and the first encapsulant layer has a first encapsulant thickness that is different from a second encapsulant thickness of the second encapsulant layer.

13. The thermal management device of claim 1, wherein the folded graphite sheet includes a first graphite core and a second graphite core of the plurality of graphite cores, and the first graphite core has a first core thickness that is different from a second core thickness of the second graphite core.

14. The thermal management device of claim 1, wherein the folded graphite sheet includes a graphite core of the plurality of graphite cores with an in-plane thermal conductivity of at least 500 Watts per meter-Kelvin (W/m-K).

15. A thermal management device comprising,
   a folded graphite sheet configured to receive and exhaust heat from a heat source, the folded graphite sheet including:
      a plurality of graphite cores; and
      an encapsulant on an outer surface of the graphite core, wherein the encapsulant is an electrically insulating material.

16. The thermal management device of claim 15, wherein at least one graphite core of the plurality of graphite cores has an in-plane anisotropic thermal conductivity.

17. The thermal management device of claim 16, wherein the encapsulant has an encapsulant thickness and at least one graphite core of the plurality of graphite cores has a core thickness, and the encapsulant thickness and core thickness are in an encapsulant ratio between 2% and 50%.

18. The thermal management device of claim 15, wherein the folded graphite sheet includes an intermediate encapsulant layer between a first graphite core and a second graphite core of the plurality of graphite cores that electrically insulates the first graphite core from the second graphite core.

19. A method of manufacturing a thermal management device, the method comprising:
   forming a bend in a graphite sheet including a plurality of graphite cores, wherein forming the bend includes elastically deforming an encapsulant layer of the graphite sheet; and
   heating at least a portion of the graphite sheet to reduce elastic stress in the encapsulant layer.

20. The method of claim 19, wherein the encapsulant layer is an intermediate encapsulant layer between a first graphite core and a second graphite core of the plurality of graphite cores.

* * * * *